(12) United States Patent
Chen et al.

(10) Patent No.: US 9,961,795 B2
(45) Date of Patent: May 1, 2018

(54) POWER SUPPLY SYSTEM FOR SHELVING SYSTEM

(71) Applicants: Self Electronics Co., Ltd., Ningbo, Zhejiang (CN); Wanjiong Lin, Ningbo, Zhejiang (CN); Self electronics USA Corporation, Norcross, GA (US)

(72) Inventors: Dong Chen, Zhejiang (CN); Jianguo Dong, Zhejiang (CN)

(73) Assignee: Self Electronics Co., Ltd., Ningbo (CN)

( * ) Notice: Subject to any disclaimer, the term of this patent is extended or adjusted under 35 U.S.C. 154(b) by 0 days. days.

(21) Appl. No.: 15/629,873

(22) Filed: Jun. 22, 2017

(65) Prior Publication Data

US 2018/0014423 A1    Jan. 11, 2018

(30) Foreign Application Priority Data

Jun. 22, 2016  (CN) .......................... 2016 1 0470525

(51) Int. Cl.
*H01R 4/60*  (2006.01)
*H05K 7/14*  (2006.01)
*H05K 1/02*  (2006.01)
*H01R 13/24* (2006.01)

(52) U.S. Cl.
CPC ............ *H05K 7/1422* (2013.01); *H05K 1/02* (2013.01); *H01R 13/2478* (2013.01)

(58) Field of Classification Search
CPC .... H01R 25/142; H01R 25/145; H01R 25/14; H05K 7/1422; H05K 1/02; H05K 7/1427; H05K 7/1489; H05K 2201/09145

USPC .......................... 439/110–121, 207, 638, 212
See application file for complete search history.

(56) References Cited

U.S. PATENT DOCUMENTS

| | | | | |
|---|---|---|---|---|
| 4,973,796 A * | 11/1990 | Dougherty | ................ | E04B 2/82 174/494 |
| 5,690,415 A * | 11/1997 | Krehl | ....................... | A47F 5/101 108/23 |
| 6,055,160 A * | 4/2000 | Schmidt | ................. | H01B 17/30 361/742 |
| 6,527,565 B1 * | 3/2003 | Johns | ..................... | H01R 25/14 362/418 |
| 2008/0198582 A1 * | 8/2008 | Cox | ....................... | A47B 97/00 362/133 |

(Continued)

*Primary Examiner* — Steven T Sawyer
(74) *Attorney, Agent, or Firm* — Wang Law Firm, Inc.

(57) ABSTRACT

A power supply system for shelving system includes a support arm, and an electrical supply device mounted on the mounting plate. The support arm includes a mounting hole, and a mounting plate disposed in the mounting hole. The thickness of the mounting plate is less that the depth of the mounting hole. The electrical supply device includes a circuit board, and a first protection cover covering the circuit board. The circuit board is clamping between the mounting plate and the first protection cover. A side wall of the first protection cover opposite to the circuit board is flush with a side wall of the mounting hole. The assembly of the support arm can be completed without being affected by the electrical supply device as long as the end of the support art can be inserted into the punched hole as the side wall of the first protection cover opposite to the circuit board is flush with the side wall of the mounting hole.

10 Claims, 4 Drawing Sheets

(56) References Cited

U.S. PATENT DOCUMENTS

| | | | | |
|---|---|---|---|---|
| 2011/0044030 A1* | 2/2011 | Pichel | ............... | A47F 11/10 |
| | | | | 362/125 |
| 2014/0349502 A1* | 11/2014 | Meis | ............... | A47B 97/00 |
| | | | | 439/212 |
| 2016/0154440 A1* | 6/2016 | Ni | ............... | G06F 1/183 |
| | | | | 361/679.58 |
| 2017/0310090 A1* | 10/2017 | Woodley | ............... | H02B 1/20 |

\* cited by examiner

POWER SUPPLY SYSTEM FOR SHELVING SYSTEM

RELATED APPLICATION

This present application claims benefit of the Chinese Application, CN201610470525.0, filed on Jun. 22, 2016.

BACKGROUND

1. Technical Field

The present application relates to lighting equipments, and more particularly to a power supply system for shelving system.

2. Description of the Related Art

Light emitting diode (LED) is growing in popularity due to decreasing costs and long life compared to incandescent lighting and fluorescent lighting. Recently, a number of LED lighting apparatuses have been designed to replace the halogen apparatus, as well as other traditional incandescent or fluorescence lighting apparatuses. LED lightings also are used to shelf track lighting device. Shelves are used in very wide range, such as in shopping malls, logistics warehouses, factory warehouses, etc., which need shelves to place goods. For these shelves, lighting is necessary, especially in the mall, it has particularly high requirements of lighting, such as saving space, security, easy assembly, beautiful, and so on.

In the prior art, a power source for supplying electric power to the LED lighting mounted on the shelf irradiation surface is generally provided on the back of the shelf. Therefore, it is need to pass through wires from the shelf irradiation surface to the back of the shelf so as to electrically connect the LED lighting with the power source supply. On one hand, it is inconvenient to arrange the wires and has more and messy wires due to the above power supply method. As a result, it is not advantageous for maintenance and aesthetics. On the other hand, as the shelves are required to have a strong versatility to be able to place different kinds of goods, it is necessary to set different mounting position of the shelf boards, such as removing it or replacing it. A patent application, whose Chinese application number is CN 201520163602.9, and title is a power supply system for shelf track lighting device, publics a shelves for solving the above problems. However, the ejection plug provided on the support arm of the shelves protrudes from the side of the support arm. Usually for beauty of the shelves, the components, including vertical rails, backboards, or the like, have very small tolerance. However, when the backboards have slightly wrong, it may difficult to install these components due to the ejection plug provided on the support arm.

Therefore, it is necessary to provide a power supply system for shelving system which makes it possible to solve the above problems.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout two views.

DETAILED DESCRIPTION

The present application is illustrated by way of example and not by way of limitation in the figures of the accompanying drawings. It should be noted that references to "an" or "one" embodiment in this application are not necessarily to the same embodiment, and such references mean at least one.

Figure 1:
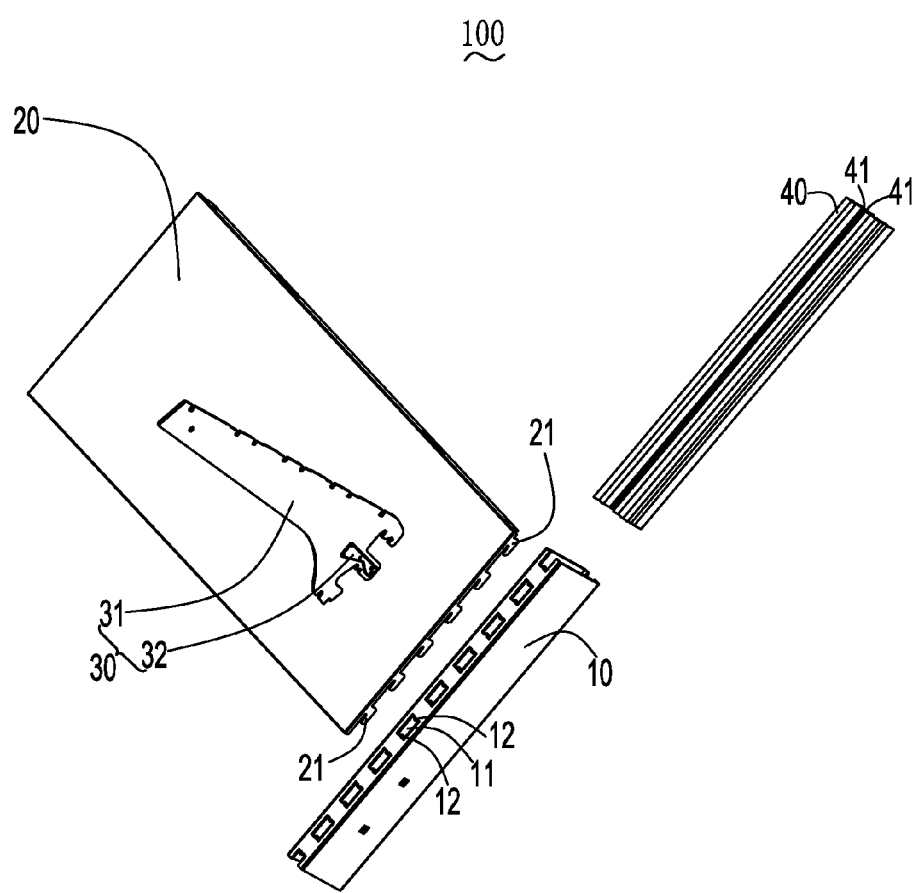
FIG. 1 is an exploded view of a power supply system for shelving system according to an embodiment.
Figure 2:
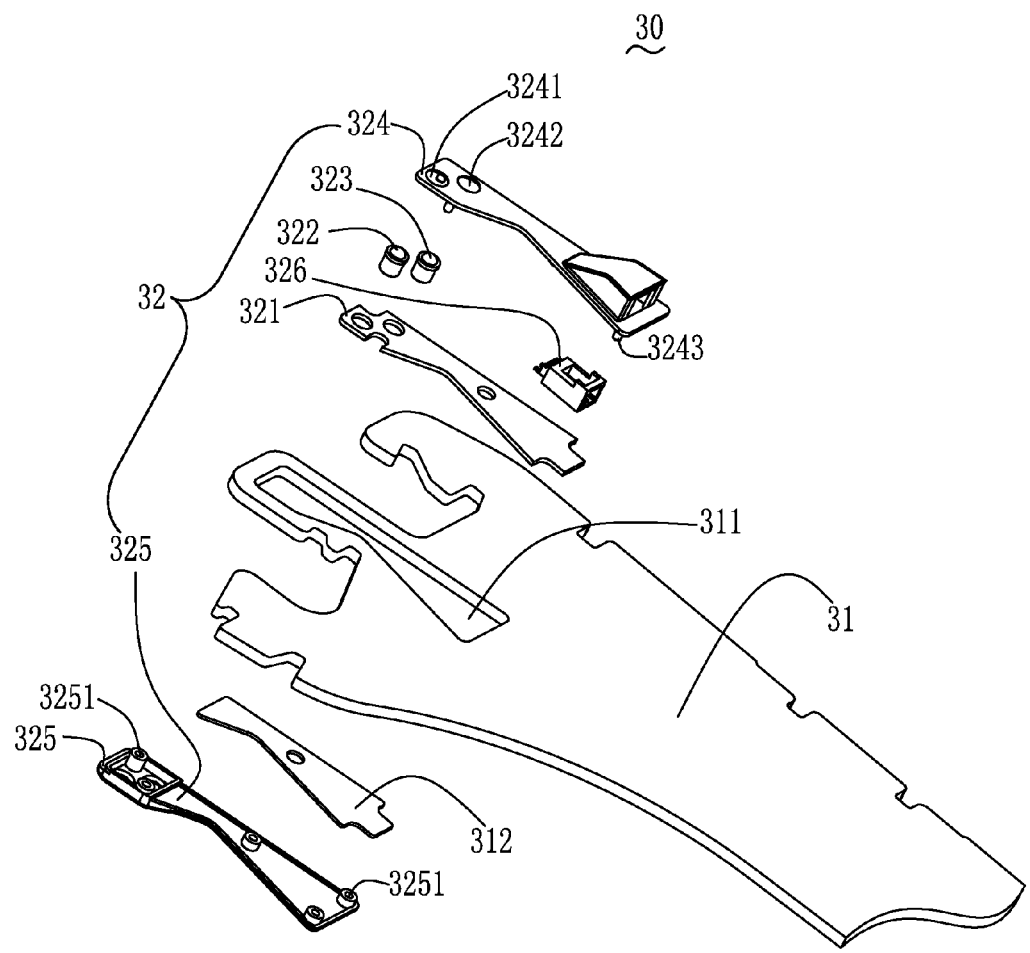
FIG. 2 is an exploded view of the power supply system of FIG. 1.
Figure 3:
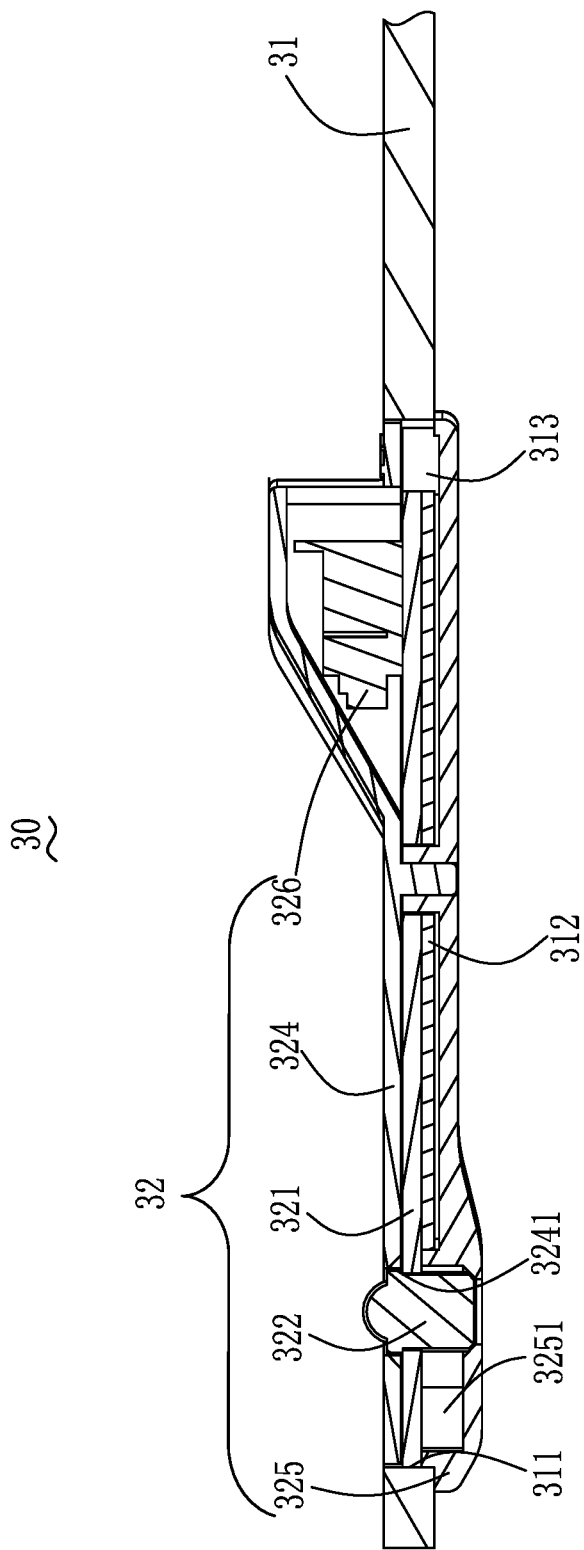
FIG. 3 is a cross section view of the power supply system of FIG. 2.
Figure 4:
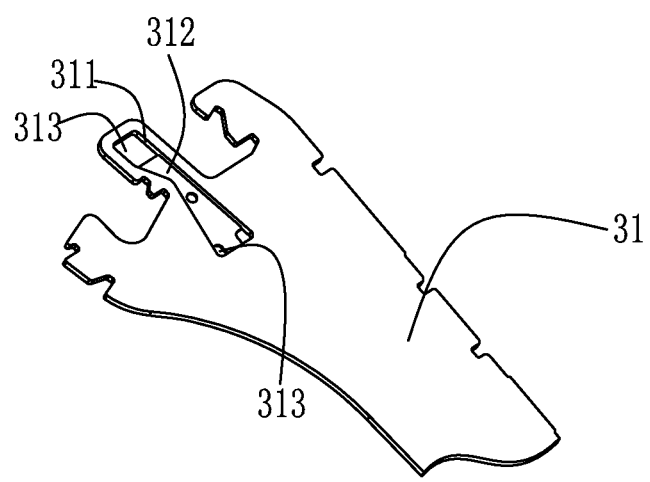
FIG. 4 is a schematic view of a support arm of the power supply system for shelving system of FIG. 1.

Referring to FIG. 1 to FIG. 3, a power supply system 100 for shelving system according to an embodiment is shown. The shelving system include a plurality of vertical shelf rails 10, a lot of backboards 20 disposed between the two vertical shelf rails 10, a plurality of power supply system 100 suspending on the vertical shelf rails 10, and a plurality of bus bars 40 disposed in the vertical shelf rails 10. It can be understood that the shelving system further includes some carrier elements, wires, and LED lightings mounted on the carrier elements, which are well known for a person skilled in the art and not described in detail.

Each of the vertical shelf rails 10 is made of metal material and is a hollow rail having a rectangle cross-section. The vertical shelf rail 10 includes a plurality of punched holes 11, and a locating protrudes 12 provided on one side wall of the punched holes 11. The punched holes 11 have a rectangle shape and are opened along an extending direction of the vertical shelf rail 10 and spaced apart from each other. The locating protrudes 12 are disposed on a side wall of the punched holes 11 which is perpendicular to the extending direction of the vertical shelf rail 10. In order to make the vertical shelf rail 10 facilitate to use and no need to distinguish the upper and lower of the vertical shelf rail 10, two protrudes 12 are provided respectively two side walls of the vertical shelf rail 10 which are perpendicular to the extending direction thereof.

The backboards 20 may be made of sheet metal and includes a plurality of catching hooks 21. The catching hooks 21 are perpendicular to the body of the backboard 20. Each of the catching hooks 21 includes an arm for clamping the side wall of the punched holes 11, that is, which is perpendicular to the extending direction of the vertical shelf rail 10. When one of the pluralities of backboards 20 is mounted two vertical shelf rails 10 which are spaced apart from each other, the relative position of the backboard 20 and the vertical shelf rail 10 can be fixed.

The power supply system 30 includes a support arm 31, and an electrical supply device 32 mounted on the support arm 31. The support arm 31 is used to place the parts, such as carrier elements. One end of the power supply system 30 is clamped into one of the punched holes 11 of the vertical shelf rail 10. In order to make one end of the support arm 31 tightly hold into the punched hole 11, a number of hooks (not labeled) are provided on the one end of the support arm 31. The pluralities of the hooks are caught respectively in the different punched holes 11, thereby holding the support arm 31 in the vertical shelf rail 10 using the lever principle and the gravitational force of the carrier elements. The assembling method of the support arm 31 is well known for a person skilled in the art and not described in detail. The support arm 31 includes a mounting hole 311, and a mounting plate 312 provided in the mounting hole 311. The mounting hole 311 is opened an end of the support arm 31 which is inserted into the punched hole 11 so as to electrically connected the electrical supply device 32 to the bus bar 40. The mounting hole 311 has a same or similar configuration with electrical supply device 32 so as to accommodate the electrical supply device 32 therein. The mounting plate 312 is disposed in the mounting hole 311 and has less thickness than the mounting hole 311. The mounting plate 312 may be formed by milling the mounting hole 311 or by welding a metal plate. In the present embodiment, the mounting plate 312 is formed by welding for reducing cost. One side of the mounting plate 312 is flush with one side of the mounting hole 311 to form a groove for placing the electrical supply device 32. Two hollow holes 313 at both ends of the mounting plate 312 is provided between the mounting hole 311 and the mounting plate 312 and is configured for assembling the electrical supply device 22. The specific assembly principle thereof will be described below The electrical supply device 32 is mounted on the mounting plate 312 and inclues a circuit board 321, a positive electrical contact 322 disposed on the circuit board 321, a negative electrical contact 323 disposed on the circuit board 321, a first protection cover 324 covering one side of the circuit board 321, a second protection cover 325 covering the other side of the circuit board 321, and a chip socket 326 disposed on the circuit board 321. The circuit board 321 provides two wires thereon, and the two wires are electrically connected to the positive and negative electrical contacts 322, 323 respectively. As well known, the wires provided on the circuit board 321 can provide a litter ratio voltage, such as 110V or 220V, which is appropriate for small power appliances, such as LED lighting. The positive and negative electrical contacts 322, 323 have the same structure and operating principle, with only positive and negative. The positive and negative electrical contacts 322, 323 are electrically connected to the positive and negative poles of the bus bar 40 to achieve the purpose of electrically connection. In order to fit closely the positive and negative electrical contacts 322, 323 with the bus bar 40 and avoid false connection from causing the LED lamp to be powered abnormally, the positive and negative electrical contacts 322, 323 are a push-in resilient ball head plunger. The push-in resilient ball head plunger is a standard part of the prior art and includes a semi-closed cylinder, a ball, and a spring sandwiched between the semi-closed cylinder and the ball. The diameter of the ball is larger than that of the mouth of the semi-closed cylinder so that the portion of the ball may be exposed to the mouth of the semi-closed cylinder and retracted in the semi-closed cylinder under the pressure of the external force. A first and second through holes 3241, 3242 are provided on the first protection cover 324 and are configured for extending the positive and negative electrical contacts 322, 323 out of therefrom so as to electrically connected with the bus bar 40. As there is the first protection cover 324, the circuit board 321 is clamped between the mounting plate 312 and the first protection cover 324 so as to protect the circuit board 321. The sum of the thicknesses of the circuit board 321 and the first protection cover 324 is equal to the difference between the depth of the mounting hole 311 and the thickness of the mounting plate 312. Therefore, the side wall of the first protection cover 324 opposite to the circuit board 321 is flush with that of the mounting hole 311. It is of course understood that there are many ways in which the side walls of the first protection cover 324 opposite to the circuit board 321 are flush with the side walls of the mounting holes 311. In the present embodiment, it is only an embodiment. The assembling methods of the first protection cover 324 may have many, such as Welded, caulked, or fastened to the mounting plate 312 using fasteners. In the present embodiment, the first protection cover 324 is coupled to the second protection cover 325. The primary purpose of the second protection cover 325 is to protect the back of the positive and negative electrical contacts 322, 323. Since an axial length of the positive and negative electrical contacts 322, 323 is larger than the sum of the thickness of the circuit board 321 and the first protection cover 324, ends of the positive and negative electrical contacts 322, 323 pass through the hollow holes 313 respectively. Therefore, it is need the second protection cover 325 to protect the positive and negative electrical contacts 322, 323 from short circuit. It may be understood that if the positive and negative electrical contacts 322, 323 are protected by other means, such as using a glue filling method, the second protection cover 325 may not be used. The second protection cover 325 is also provided with a plurality of methods such as welding, riveting, or fastening on the mounting plate 312 using fasteners. However, in the present embodiment, the first protection cover 324 provides at least two pins 3243, and the second protection cover 325 provides at least two holes 3251. The at least two pins 3243 pass through the hollow holes 313 and are inserted into the holes 3251 so as to fix the relative position of the first and second protection covers 324, 325. In the present embodiment, the first and second protection covers 324, 325 respectively have 5 pins 3243 and 5 holes 3251. The 5 pins 3243 and 5 holes 3251 are respectively distributed at different positions of the first and second protective covers 324, 325. In addition, the pins 3243 are in interference fit with the holes 3251. Therefore, the pins 3243 can be inserted into the holes 3251 directly, which make assembly easier. The chip socket 326 is also a standard member known to these skiled in the art and is used to electrically connect to the circuit board 321 for electrically connecting with a plug of LED lighting.

The bus bar 40 is received in the vertical shelf rail 10 and includes two current conductors 41 spaced apart and insulated from each other. Further, the two current conductors 41 are arranged vertically so that the two current conductors 41 are arranged along the axial direction of the vertical shelf rail 10. As a result, the vertical shelf rail 10 can supply power to the electrical supply device 32 at an arbitrary position. In the present embodiment, the current conductors 41 is made of copper and are tiled on the same PCB (Printed Circuit Board) to be able to power LED lightings.

When the support arm 30 is inserted into the punched hole 11 and the positive and negative electrical contacts 322, 323 are electrically connected to the two current conductors 41 of the bus bar 40 so as to achieve the purpose of electrical connection. When the backboard 20 and the support arm 30 are mounted into the punched hole 11, the assembly of the support arm 30 can be completed without being affected by the electrical supply device 32 as long as the end of the support art 30 can be inserted into the punched hole 11 as the side wall of the first protection cover 324 opposite to the circuit board 321 is flush with the side wall of the mounting hole 311, that is, flush with the side wall of the support arm 30. As a result, the effect caused by the tolerance and fit is reduced to a minimum value when the vertical shelf rail 10, backboard 20, and the support arm 30 are assembled.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power supply system for shelving system, comprising:
   a support arm, the support arm comprising a mounting hole, and a mounting plate disposed in the mounting hole, the thickness of the mounting plate being less than the depth of the mounting hole; and
   an electrical supply device, the electrical supply device being mounted on the mounting plate and comprising a circuit board, and a first protection cover covering the circuit board, the circuit board being clamping between the mounting plate and the first protection cover, a side wall of the first protection cover opposite to the circuit board being flush with a side wall of the mounting hole.

2. The power supply system for shelving system as claimed in claim 1, wherein the sum of a thickness of the circuit board and a thickness of the first protection cover is equal to the difference between the depth of the mounting hole and the thickness of the mounting hole.

3. The power supply system for shelving system as claimed in claim 2, wherein one side of the mounting plate is flush with that of the mounting hole, the circuit board is mounted in a groove form by the mounting hole and the mounting plate.

4. The power supply system for shelving system as claimed in claim 1, wherein the first protection cover is fixed on the mounting plate by fasteners.

5. The power supply system for shelving system as claimed in claim 1, wherein the electrical supply device further comprises a second protection cover, the second protection cover is disposed at one side of the circuit board opposite to the first protection cover, the circuit board and the mounting plate are clamped between the first and second protection covers.

6. The power supply system for shelving system as claimed in claim 5, wherein at least two hollow holes are provided between the mounting plate and the mounting hole.

7. The power supply system for shelving system as claimed in claim 6, wherein the first protection cover provides at least two pins disposed thereon, the second protection cover provides at least two holes opened therein, the at least two pins pass through the hollow holes and are inserted into the two hole respectively so as to fix the relative position of the first and second protection covers.

8. The power supply system for shelving system as claimed in claim 7, wherein the pins are in interference fit with the holes.

9. The power supply system for shelving system as claimed in claim 1, wherein the electrical supply device further comprises a positive electrical contact and a negative electrical contact, the positive and negative electrical contacts are mounted on the circuit board, a first and second through holes are provided on the first protection cover and spaced apart from each other, the first and second through holes is configured for making the positive and negative electrical contacts extend out of the first protection cover.

10. The power supply system for shelving system as claimed in claim 9, wherein the positive and negative electrical contacts are push-in resilient ball head plunger.

* * * * *